United States Patent
Avci et al.

(10) Patent No.: US 10,236,345 B2
(45) Date of Patent: Mar. 19, 2019

(54) FIELD EFFECT TRANSISTOR HAVING A FERMI FILTER BETWEEN A SOURCE AND SOURCE CONTACT THEREOF

(71) Applicant: Intel Corporation, Santa Clara, CA (US)

(72) Inventors: Uygar E. Avci, Portland, OR (US); Ian A. Young, Portland, OR (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 15/569,269

(22) PCT Filed: Jun. 22, 2015

(86) PCT No.: PCT/US2015/036950
§ 371 (c)(1),
(2) Date: Oct. 25, 2017

(87) PCT Pub. No.: WO2016/209202
PCT Pub. Date: Dec. 29, 2016

(65) Prior Publication Data
US 2018/0301533 A1    Oct. 18, 2018

(51) Int. Cl.
*H01L 29/267*    (2006.01)
*H01L 29/08*     (2006.01)
*H01L 29/78*     (2006.01)
*H01L 29/165*    (2006.01)
*H01L 29/205*    (2006.01)

(52) U.S. Cl.
CPC ........ *H01L 29/0847* (2013.01); *H01L 29/165* (2013.01); *H01L 29/205* (2013.01); *H01L 29/267* (2013.01); *H01L 29/78* (2013.01)

(58) Field of Classification Search
CPC .. H01L 29/165; H01L 29/267; H01L 29/0847
See application file for complete search history.

(56) References Cited

U.S. PATENT DOCUMENTS

| 5,561,387 A * | 10/1996 | Lee ................ G01R 31/2621 324/762.09 |
|---|---|---|
| 2010/0140589 A1 | 6/2010 | Ionescu et al. |
| 2010/0200916 A1 | 8/2010 | Gossner et al. |
| 2012/0298961 A1 | 11/2012 | Iacopi et al. |
| 2015/0041847 A1 | 2/2015 | Kotylar et al. |

OTHER PUBLICATIONS

International Preliminary Report on Patentability for International Patent Application No. PCT/US15/036950, dated Jan. 4, 2018.
(Continued)

*Primary Examiner* — Quoc Hoang
(74) *Attorney, Agent, or Firm* — Green, Howard & Mughal LLP

(57) ABSTRACT

Fermi filter field effect transistors having a Fermi filter between a source and a source contact, systems incorporating such transistors, and methods for forming them are discussed. Such transistors may include a channel between a source and a drain both having a first polarity and a Fermi filter between the source and a source contact such that the Fermi filter has a second polarity complementary to the first polarity.

19 Claims, 7 Drawing Sheets

(56) References Cited

OTHER PUBLICATIONS

International Search Report & Written Opinion, dated Mar. 22, 2016, for PCT Patent Application No. PCT/US15/36950.
Search Report dated Jan. 18, 2019 for EP Patent Application No. 15896496.5.
Abdi, D. et al., "In-Built N+ Pocket p-n-p-n Tunnel Field-Effect Transistor", IEEE Electron Device Letters, IEEE Service Center, NY, NY, US, vol. 35, No. 12, Dec. 1, 2014, pp. 1170-1172 (3 pages), XP011565024.
Avci, U. et al., "Hererojunction TFET Scaling and Resonant-TFET for Steep Subthreshold Slope at sub-9nm Gate-Length", 2013 IEEE International Electron Devices Meeting, Dec. 9-1, 2013, Washington DC, USA. pp. 4.3.1-4.3.4, XP055540206.
Kotlyar, R. et al., "Bandgap Engineering of Group IV Materials for Complementary n and p Tunneling Field Effect Transistors", Applied Physics Letters, A I P Publishing LLC, US vol. 102, No. 11, pp. 113103-113106 (4 pages), Mar. 18, 2013, XP012171573.

* cited by examiner

900

```
┌─────────────────────────────────────────────────────┐
│ Form a Source and a Drain each having a First Polarity │
│ Adjacent to a Channel such that the Channel is between the │
│            Source and the Drain                     │
│                      901                            │
└─────────────────────────────────────────────────────┘
                        ↓
┌─────────────────────────────────────────────────────┐
│         Dispose a Gate Adjacent to the Channel      │
│                      902                            │
└─────────────────────────────────────────────────────┘
                        ↓
┌─────────────────────────────────────────────────────┐
│ Dispose a Fermi Filter having a Polarity Complementary to the │
│     Source and the Drain Adjacent to the Source     │
│                      903                            │
└─────────────────────────────────────────────────────┘
                        ↓
┌─────────────────────────────────────────────────────┐
│      Form a Source Contact Adjacent to the Fermi Filter │
│                      904                            │
└─────────────────────────────────────────────────────┘
```

FIELD EFFECT TRANSISTOR HAVING A FERMI FILTER BETWEEN A SOURCE AND SOURCE CONTACT THEREOF

CLAIM OF PRIORITY

This Application is a National Stage Entry of, and claims priority to, PCT Application No. PCT/US15/36950, filed on 22 Jun. 2015 and titled "SOURCE FERMI FILTER FIELD EFFECT TRANSISTOR", which is incorporated by reference in its entirety for all purposes.

TECHNICAL FIELD

Embodiments of the invention generally relate to low leakage and low power field effect semiconductor transistors and, more particularly, relate to source Fermi filter field effect transistors and associated devices.

BACKGROUND

In the context of integrated circuits, it may be desirable to implement low power transistors having low leakage currents. However, current transistor designs and implementations may have substantial limitations. For example, metal-oxide-semiconductor field-effect transistors (MOSFETs) have a sub-threshold slope with a theoretical limit of kT/q (e.g., such that k is the Boltzmann constant, T is temperature, and q is the elementary charge). At room temperature, for example, the theoretical limit of the sub-threshold slope (SS) may be 60 mV/dec (millivolts per decade) for MOSFETs.

In particular, for a leakage current target, which may determine an integrated circuit's standby power requirement, a MOSFET may only increase at a maximum rate of kT/q (e.g., 60 mV/dec at room temperature) from the leakage current target to the MOSFET's on-current. Furthermore, for low active power, the integrated circuit may be required to operate at lower supply voltages. However, due to the limited (e.g., kT/q) rate of increase of current from leakage current to on-current, when a MOSFET is operated at low supply voltages, the on-current (and therefore performance) is significantly reduced because it may be operating close to its threshold voltage.

In other implementations, tunneling field-effect transistors (TFETs) may be implemented. Such TFETs may achieve sharper turn-on behavior (e.g., a lower sub-threshold slope than MOSFETs), which may enable higher on-currents than MOSFETs at lower supply voltages. However, to attain such TFET characteristics, a variety of materials and/or manufacturing advancements may be needed, such as developing exotic channel materials, attaining low defect density oxides on such exotic channel materials, and/or manufacturing thin transistor bodies using such exotic materials.

As such, existing technologies do not provide low power transistors having high performance and low leakage currents. Furthermore, replacement technologies such as TFETs may require significant development efforts due to novel material requirements. Such problems may become critical in low power integrated circuit implementations.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Furthermore, where considered appropriate, reference labels have been repeated among the figures to indicate corresponding or analogous elements. In the figures:

FIG. 9 is a flow diagram illustrating an example process for forming a transistor having a source Fermi filter;

DETAILED DESCRIPTION

Figure 1:
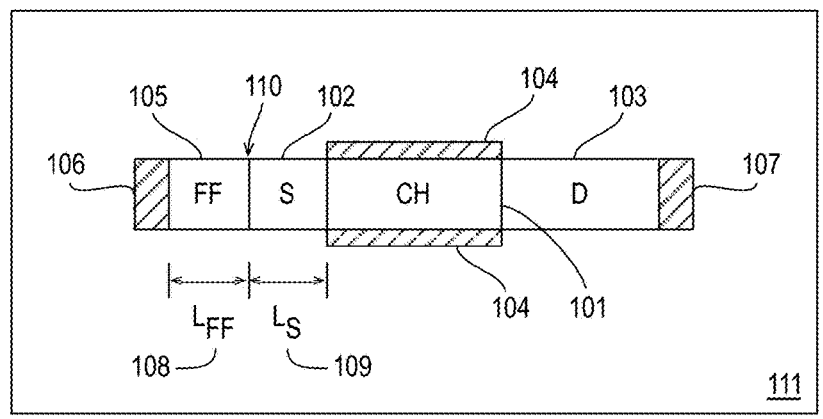
FIG. 1 is a plan view of an example transistor.

One or more embodiments or implementations are now described with reference to the enclosed figures. While specific configurations and arrangements are discussed, it should be understood that this is done for illustrative purposes only. Persons skilled in the relevant art will recognize that other configurations and arrangements may be employed without departing from the spirit and scope of the description. It will be apparent to those skilled in the relevant art that techniques and/or arrangements described herein may also be employed in a variety of other systems and applications other than what is described herein.

Reference is made in the following detailed description to the accompanying drawings, which form a part hereof, wherein like numerals may designate like parts throughout to indicate corresponding or analogous elements. It will be appreciated that for simplicity and/or clarity of illustration, elements illustrated in the figures have not necessarily been drawn to scale. For example, the dimensions of some of the elements may be exaggerated relative to other elements for clarity. Furthermore, it is to be understood that other embodiments may be utilized and structural and/or logical changes may be made without departing from the scope of claimed subject matter. It should also be noted that directions and references, for example, up, down, top, bottom, over, under, and so on, may be used to facilitate the discussion of the drawings and embodiments and are not intended to restrict the application of claimed subject matter. Therefore, the following detailed description is not to be taken in a limiting sense and the scope of claimed subject matter defined by the appended claims and their equivalents.

In the following description, numerous details are set forth. However, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "one embodiment" means that a particular feature, structure, function, or characteristic described in connection with the embodiment is included in at least one embodiment of the invention. Thus, the appearances of the phrase "in an embodiment" or "in one embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe structural relationships between components. It should be understood that these terms are not intended as synonyms for each other. Rather, in particular embodiments, "connected" may be used to indicate that two or more elements are in direct physical or electrical contact with each other. "Coupled" may be used to indicate that two or more elements are in either direct or indirect (with other intervening elements between them) physical or electrical contact with each other, and/or that the two or more elements co-operate or interact with each other (e.g., as in a cause an effect relationship).

The terms "over," "under," "between," "on", and/or the like, as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening features.

As used in throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

Transistors, devices, apparatuses, computing platforms, and methods are described below related to transistors having Fermi filters disposed between a source and a source contact.

As described above, it may be advantageous to implement low power transistors having low leakage currents. However, current transistor designs such as MOSFETs may have limitations due to the theoretical limit of their sub-threshold slope. For example, due to the limited rate of increase of current from leakage current (e.g., which may determine standby power of a device) to on-current (e.g., which may determine performance of a device), when a MOSFET is operated at a low supply voltage, the on-current may be significantly reduced because it may be operating close to its threshold voltage. Alternative designs such as TFETs may offer sharper turn-on behavior (e.g., a lower sub-threshold slope). However, such designs may be difficult to implement and manufacture due to the need for exotic channel materials, the need for low defect densities on such exotic channel materials, and/or the need to manufacture thin transistor bodies using such exotic materials.

Example transistors discussed herein may provide sharper turn-on behavior and the advantage of using conventional materials. For example, transistors discussed herein may provide low leakage, which may be employed in integrated circuits (and thus products) having low standby power. In some examples, a transistor may include a channel disposed between a source and a drain such that the source and the drain have a first polarity (e.g., the source and drain may be N+ doped or P+ doped materials or the like). The transistor may have a gate adjacent to the channel and a Fermi filter disposed between the source and a source contact such that the Fermi filter has a second polarity complementary to the first polarity (e.g., the Fermi filter may be P+ doped when the source is N+ doped or N+ doped when the source is P+ doped or the like). Furthermore, the Fermi filter and source may form a tunnel junction therebetween and the tunnel junction may be some lateral distance from the gate. For example, the tunnel junction may be away from the gate such that it is not under or directly adjacent to the gate or the like.

Such transistors may offer high energy filtering (e.g., via the Fermi filter) and the implementation of conventional (e.g., conventional state of the art) materials. For example, a transistor implementing a Fermi filter as discussed herein may be characterized as a Fermi filter field effect transistor (F3ET). Such F3ETs may offer low leakage current, sharper turn-on characteristics, and increased performance with respect to current transistors. Furthermore, such F3ETs may, in some examples, be implemented with conventional materials (e.g., conventional channel, oxide, and body materials).

FIG. 1 is a plan (top-down) view of an example transistor 100, arranged in accordance with at least some implementations of the present disclosure. As shown in FIG. 1, transistor 100 may include a channel 101, a source 102, a drain 103, a gate 104, a Fermi filter 105, a source contact 106, and a drain contact 107 formed on and/or within substrate layer 111. As shown, channel 101 may be disposed between source 102 and drain 103. Furthermore, source 102 and drain 103 may have a first polarity, an individual polarity, a preselected polarity, or the like (e.g., source 102 and drain 103 may have the same polarity). Drain contact 107 may be coupled to drain 103 and drain contact 107 may include any suitable contact material such as a contact metal having the same polarity as drain 103. Also, source contact 106 may be coupled to Fermi filter 105. Source contact 106 may include any suitable contact material such as a contact metal or the like. In some examples, source contact 106 may have the same polarity as Fermi filter 105 for lower contact resistance and, in other examples, source contact 106 may have a complementary polarity with respect to Fermi filter 105 and the same polarity as 107 for practical fabrication purposes.

As shown, gate 104 may be adjacent to channel 101 such that gate 104 may provide an electric field to channel 101 to switch transistor 100. The operation of transistor 100 with respect to voltages applied via gate 104 is discussed further elsewhere herein. Gate 104 may include any suitable gate material, stack of materials, gate stack, or the like. For example, gate 104 may include a gate dielectric such as an oxide, a high-k material, or the like and a gate metal or conductor such as doped polysilicon, a metal or metals, or the like.

In the illustrated example, transistor 100 may be a dual gate transistor (e.g., having a dual gate transistor structure) such that channel 101 may extend above substrate layer 111 (e.g., channel 101 may be formed within a fin of the material of substrate layer 111 or another material) and between gate 104 (e.g. with gate 104 including two gate electrodes). In other examples, transistor 100 may be a FinFET transistor (e.g., having a FinFET transistor structure) such that channel 101 may extend above a substrate layer 111 (e.g., channel 101 may be formed within a fin of the material of substrate layer 111 or another material) and gate 104 may wrap around channel 101. In yet other examples, transistor 100 may be a planar transistor (e.g., having a planar transistor structure) such that channel 101 may be formed within substrate layer 111 and gate 104 may be disposed over or on channel 101. For example, the transistor elements discussed herein may be implemented via any suitable transistor structure such as a dual gate transistor structure, a FinFET transistor structure, a planar transistor structure, or the like. In some examples, transistor 100 may be a nanowire transistor, where gate 104 wraps around the channel 101 fully.

Substrate layer 111 may include any suitable material or materials such as those discussed with respect to Tables 1-4 or elsewhere herein. For example, substrate layer 111 may include monocrystalline silicon, germanium, germanium tin, indium arsenide, indium antimonide, gallium antimonide, silicon germanium, a III-V based material, silicon carbide, sapphire, or the like. Furthermore, in some examples, substrate layer 111 may be disposed on a substrate (e.g., a bulk substrate, not shown) having the same material as substrate layer 111 or a different material such as a support material or a bulk material or the like or the like. For example, the substrate may include monocrystalline silicon, germanium, germanium tin, indium arsenide, indium antimonide, gallium antimonide, silicon germanium, a III-V based material, silicon carbide, sapphire, or the like.

As discussed, source 102 and drain 103 may have a polarity. For example, the polarity of source 102 and drain 103 may be characterized as a first polarity, a selected polarity, an individual polarity, or the like. For example, for N-F3ET structures, source 102 and drain 103 of transistor 100 may have a negative polarity and for P-F3ET structures, source 102 and drain 103 of transistor 100 may have a positive polarity. Fermi filter 105 may have a complementary polarity with respect to the polarity of source 102 and drain 103. For example, source 102 and drain 103 may have a positive polarity and Fermi filter 105 may have a negative polarity or source 102 and drain 103 may have a negative polarity and Fermi filter 105 may have a positive polarity. For example, such a complementary polarity between source 102 and Fermi filter 105 may offer advantageous performance characteristics as discussed further herein. For example, a transistor structure including a negatively doped source and drain and a positively doped Fermi filter may be implemented for N-F3ETs and a transistor structure including a positively doped source and drain and a negatively doped Fermi filter may be implemented for N-F3ETs.

Furthermore, Fermi filter 105 and source 102 may have a tunnel junction 110 therebetween. Tunnel junction 110 may include any suitable junction between Fermi filter 105 and source 102 that may allow for the tunneling of electrons as is discussed further herein. For example, tunnel junction 110 may include a homo-junction (e.g., a junction between like materials doped to different polarities) or a hetero junction (e.g., a junction between different materials having different polarities and/or doped to different polarities). Such hetero junctions may include staggered gaps or broken gaps or the like. Fermi filter 105 may include any material or materials to provide filtering of high energy electrons as is discussed further herein. For example, Fermi filter 105 may be characterized as a Fermi filter layer, a filter, a filter layer, an electron filter, or the like.

As discussed, transistor 100 may include any material, materials, dopants, or the like in any combination to generate the described source, drain, and Fermi filter polarity characteristics. For example, as discussed, the design of transistor 100 may offer the advantage of using materials that are well characterized and/or manufacturable without extensive materials research, defect reduction, or the like. For example, Table 1 and Table 2 list example material options for N-F3ETs and P-F3ETs using silicon channel, source, and drain materials.

As shown in Table 1, for example, an N-F3ET may include an N+ doped silicon (Si) source 102, an undoped (e.g., intrinsic, i) silicon channel 101, and an N+ doped silicon drain 103. In such examples, Fermi filter 105 may be P+ doped silicon (e.g., providing a homo-junction with source 102), P+ doped germanium (Ge) (e.g., providing a hetero-junction with source 102), or P+ doped germanium tin (GeSn) (e.g., providing a hetero junction with source 102).

TABLE 1

Example Material Options for N-F3FETs with a Silicon Channel

| Source/Channel/Drain | Fermi Filter |
|---|---|
| N+/i/N+ Si | P+ Si |
| N+/i/N+ Si | P+ Ge |
| N+/i/N+ Si | P+ GeSn |

Furthermore, as shown in Table 2, a P-F3ET may include a P+ doped silicon source 102, an undoped silicon channel 101, and a P+ doped silicon drain 103. In such examples, Fermi filter 105 may be N+ doped silicon (e.g., providing a homo-junction with source 102), N+ doped indium arsenide (InAs) (e.g., providing a hetero junction with source 102), or N+ doped indium antimonide (InSb) (e.g., providing a hetero junction with source 102).

TABLE 2

Example Material Options for P-F3FETs with a Silicon Channel

| Source/Channel/Drain | Fermi Filter |
|---|---|
| P+/i/P+ Si | N+ Si |
| P+/i/P+ Si | N+ InAs |
| P+/i/P+ Si | N+ InSb |

As discussed, transistor 100 may have a channel, a source, and a drain including silicon. However, as discussed, transistor 100 may include any material or materials to provide the transistor characteristics discussed herein. Table 3 and Table 4 list additional example material options for N-F3ETs and P-F3ETs.

As shown in Table 3, in some examples, an N-F3ET may include an N+ doped indium gallium arsenide (InGaAs) source 102, an undoped (e.g., intrinsic, i) indium gallium arsenide channel 101, and an N+ doped indium gallium arsenide drain 103. In such examples, Fermi filter 105 may be P+ doped silicon (e.g., providing a hetero-junction with source 102) or P+ doped gallium antimonide (e.g., providing a hetero junction with source 102) or the like. As also shown in Table 3, in some examples, an N-F3ET may include an N+ doped indium arsenide source 102, an undoped (e.g., intrinsic, i) indium arsenide channel 101, and an N+ doped indium arsenide drain 103. In such examples, Fermi filter 105 be P+ doped silicon (e.g., providing a hetero junction with source 102) or P+ doped gallium antimonide (e.g., providing a hetero junction with source 102) or the like.

TABLE 3

Other Example Material Options for N-F3FETs

| Source/Channel/Drain | Fermi Filter |
|---|---|
| N+/i/N+ InGaAs | P+ Si |
| N+/i/N InGaAs | P+ GaSb |
| N+/i/N+ InAs | P+ Si |
| N+/i/N+ InAs | P+ GaSb |

As shown in Table 4, in some examples, a P-F3ET may include a P+ doped germanium source 102, an undoped (e.g., intrinsic, i) germanium channel 101, and a P+ doped germanium drain 103. In such examples, Fermi filter 105 be N+ doped silicon (e.g., providing a hetero junction with source 102) or N+ doped germanium (e.g., providing a homo-junction with source 102) or the like. As also shown in Table 4, in some examples, a P-F3ET may include a P+ doped gallium antimonide (GaSb) source 102, an undoped (e.g., intrinsic, i) gallium antimonide channel 101, and a P+ doped gallium antimonide drain 103. In such examples, Fermi filter 105 be N+ doped indium arsenide (e.g., providing a hetero-junction with source 102) or N+ doped indium gallium arsenide (e.g., providing a homo-junction with source 102) or the like.

TABLE 4

Other Example Material Optiher for P-F3FETs

| Source/Channel/Drain | Fermi Filter |
|---|---|
| P+/i/P+ Ge | N+ Si |
| P+/i/P+ Ge | N+ Ge |
| P+/i/P+ GaSb | N+ InAs |
| P+/i/P+ GaSb | N+ InGaAs |

As discussed, source 102, drain 103, and Fermi filter 105 may include doped materials. In some examples, source 102, drain 103, and Fermi filter 105 may be heavily doped having dopant concentrations in the range of about $10^{18}$ cm$^{-3}$ to about $10^{20}$ cm$^{-3}$, or more. For example, source 102, drain 103, and Fermi filter 105 may be characterized as doped, highly doped, heavily doped, or the like. For example, doped regions and the like are labeled using a single + herein (e.g., N+ or P+) to indicate a doping or heavy doping. Furthermore, Tables 1-4 illustrate example materials for source 102, drain 103, and Fermi filter 105. However, other materials such as any suitable materials providing a homo-junction between source 102 and Fermi filter 105 or any suitable materials providing a broken or staggered gap hetero junction between source 102 and Fermi filter 105 may be implemented via N-F3ETs and/or P-F3ETs.

With reference to FIG. 1, as shown, Fermi filter 105 may have a length, $L_{FF}$, 108 and source 103 may have a length, $L_S$, 109. For example, length 108 and length 109 may be lateral lengths along a direction from source to drain of transistor 100. Furthermore, as shown, length 109 may provide or define a lateral distance between gate 104 and tunnel junction 110. For example, as shown, tunnel junction 110 may be a lateral distance (e.g., a non-zero lateral distance) from gate 104 such that tunnel junction is not within channel 101, directly adjacent to gate 104, or the like. Such a structure (e.g., providing tunnel junction 110 a lateral distance from gate 104) may provide advantageous transistor properties as discussed herein. In the example of FIG. 1, length 109, the lateral distance between tunnel junction 110 and gate 104 and the lateral distance between tunnel junction 110 and channel 101 are the same. However, such distances or lengths may be different. For example, gate 104 may overlay a portion of source 102 or expose a portion of channel 101 such that length 109 and the lateral distance between tunnel junction 110 and gate 104 are different. Length 108, length 109, and the lateral distance between tunnel junction 110 and gate 104 may be any suitable lengths or distances. For example, length 108, length 109, and the lateral distance between tunnel junction 110 and gate 104 may be in the range of about 5 nm to 20 nm (e.g., such that the lateral distance between tunnel junction 110 and gate 104 is not less than 5 nanometers and not more than 20 nanometers), in the range of about 5 nm to 10 nm, in the range of about 10 nm to 25 nm, or the like. Furthermore, drain 103 my have a length, $L_D$, which may be any suitable length or distance similar to length 109 or the like.

As discussed, transistor 100 may be implemented based on any suitable transistor structure such as a dual gate transistor structure, a FinFET transistor structure, a planar transistor structure, or the like. For example, in a dual gate or FinFET transistor structure, a lateral distance between tunnel junction 110 and gate 104 may be a distance along a fin or other structure including channel 101 and source 102. In a planar transistor structure, a lateral distance between tunnel junction 110 and gate 104 may be a distance along substrate layer 111 including channel 101 and source 102. For example, Fermi filter 105 may be adjacent to source 102 and may extend away from source 102 along the direction of the lateral distance as shown in FIG. 1. As discussed, transistor 100 may also be based on a nanowire transistor structure. In other examples, part or all of Fermi filter 105 may be adjacent to and above (e.g., atop) source 102. In such examples, the lateral distance between tunnel junction 110 and gate 104 may be reduced. However, an effective distance (e.g., a distance along a conductive path from channel 101 thorough source 102, through Fermi filter 105, and through source contact 106) is maintained. For example, as used herein, an effective distance may include any distance along a conductive path of a transistor such as transistor 100. For example, tunnel junction 110 may be an effective distance from gate 104 such that the electrical properties of tunnel junction 110 are unchanged or substantially unchanged when gate 104 is switched or biased or the like. In other examples, region 105, 102 and 107 may be wrapped around gate 104 and channel 101 (e.g., not in a straight line) to make the transistor more compact.

Figure 2:
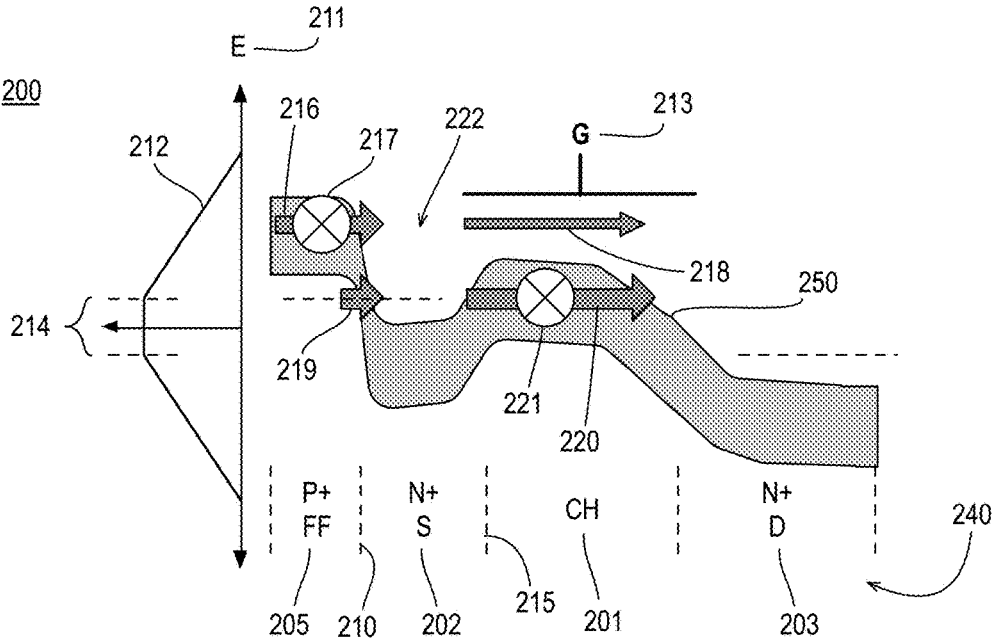
FIG. 2 illustrates an example band diagram for an example N-F3ET in an off state.

FIG. 2 illustrates an example band diagram 200 for an example N-F3ET 240 in an off state, arranged in accordance with at least some implementations of the present disclosure. As shown in FIG. 2, band diagram 200 may include a band gap 250 having a top edge indicative of a conduction band and a lower edge indicative of a valence band. For example, band gap 250 and other band gaps illustrated or discussed herein may provide energy ranges across N-F3ET 240 where no electron state may exist. Also as shown in FIG. 2, N-F3ET 240 may include a P+ doped Fermi filter 205, an N+ doped source 202, an undoped or intrinsic channel 201, and an N+ doped drain 203. For example, P+ doped Fermi filter 205, N+ doped source 202, channel 201, and N+ doped drain 203 may be implemented as Fermi filter 105, source 102, channel 101, and drain 103, respectively (please refer to FIG. 1). Furthermore, a tunnel junction 210 may be formed or provided between P+ doped Fermi filter 205 and N+ doped source 202. In the illustration of FIG. 2, for example, tunnel junction 210 may be a homo-junction with P+ doped Fermi filter 205 and N+ doped source 202 having any suitable materials as discussed herein with respect to FIG. 1. Also as shown in FIG. 2, band diagram 200 may illustrate electron energy levels across N-F3ET 240. For example, source electrons (e.g., charge carriers) may have an electron occupancy 212 over an energy range 211 at a source electrode of N-F3ET 240. As shown, electron occupancy 212 may include a high occupancy region 214. Also, as discussed, in the example of FIG. 2, gate electrode 213 may be in an off state such that N-F3ET 240 is in an off state and such that a voltage is applied across the source contact and drain contact of N-F3ET 240. For example, any current provided across N-F3ET 240 while in the off state may be undesirable leakage current.

As shown in FIG. 2 and as discussed with respect to FIG. 1, P+ doped Fermi filter 205 may be arranged at a lateral distance or effective distance from channel 201 and gate electrode 213 (e.g., about 5 to 20 nm) such that P+ doped Fermi filter 205 is spaced away from a source junction 215 between N+ doped source 202 and channel 201 (e.g., between source 102 and channel 101 in FIG. 1). For example, N+ doped source 202 may be coupled to a source contact (not shown in FIG. 2). As shown with respect to arrow 216 and blocking indicator 217, high energy electrons may be blocked from traversing from the source contact to the drain contact (e.g., to N+ doped drain 203 and on to a drain contact, not shown) by the band gap provided via P+ doped Fermi filter 205. For example, across P+ doped Fermi filter 205 high energy electron states may not occur and no leakage current associated with such high energy electrons may occur. As shown with respect to arrow 218, in some examples, high energy electrons (e.g., electrons having high energy states) may accumulate in region 222 associated with N+ doped source 202 and traverse N-F3ET 240 causing undesirable leakage current. However, such leakage current may be greatly reduced via the implementation of P+ doped Fermi filter 205. In some examples, such undesirable leakage current may be further reduced by providing high quality, low defect materials for N-F3ET 240.

As also shown in FIG. 2 via arrow 219, electrons associated with high occupancy region 214 (e.g., as shown via horizontal dashed lines in FIG. 2) and electrons having a slightly higher energy state than those in high occupancy region 214 may tunnel through tunnel junction 210 between P+ doped Fermi filter 205 and N+ doped source 202. However, as shown with respect to arrow 220 and blocking indicator 221, such electrons may be blocked from traversing based on the band gap of channel 201. For example, in the discussed off state, gate electrode 213 may not invert channel 201 to allow such electrons to flow.

Figure 3:
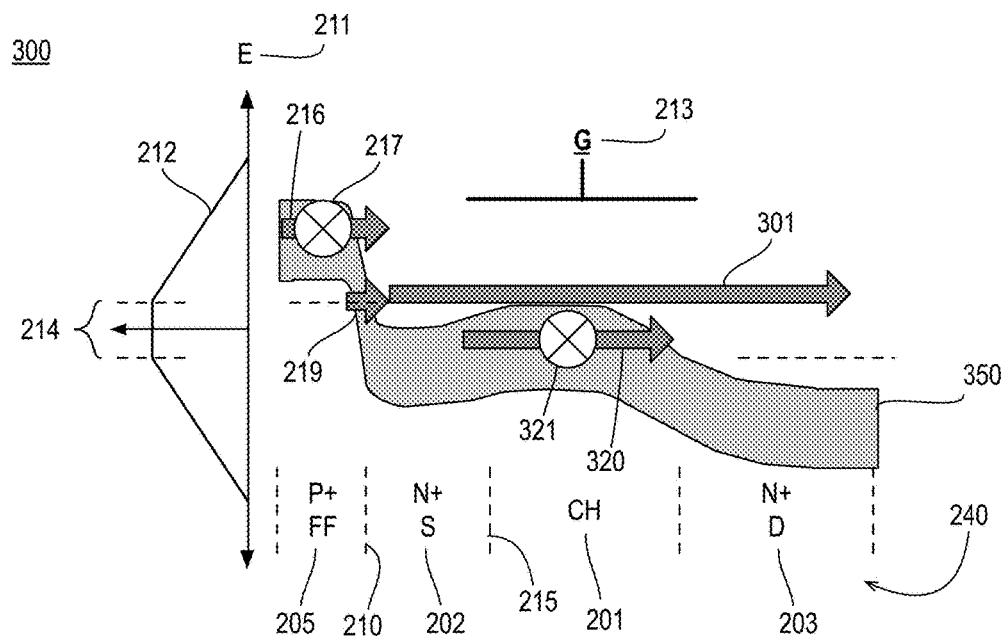
FIG. 3 illustrates an example band diagram for an example N-F3ET in an on state.

FIG. 3 illustrates an example band diagram 300 for example N-F3ET 240 in an on state, arranged in accordance with at least some implementations of the present disclosure. As shown in FIG. 3, band diagram 300 may include a band gap 350 having a top edge indicative of a conduction band and a lower edge indicative of a valence band similar to band gap 250 as illustrated in FIG. 2. In FIG. 3 however, the hump of band gap 250 (e.g., associated with blocking indicator 221) may be lowered, modified, or moved or the like based on gate electrode 213 being in an on state. Also as shown in FIG. 3, N-F3ET 240 may include P+ doped Fermi filter 205, N+ doped source 202, undoped or intrinsic channel 201, N+ doped drain 203, and tunnel junction 210 between P+ doped Fermi filter 205 and N+ doped source 202 as discussed with respect to FIG. 2. Furthermore, band diagram 300 may illustrate electron energy levels across N-F3ET 240 such that source electrons may have electron occupancy 212 (including high occupancy region 214) over energy range 211 at a source electrode of N-F3ET 240. Also, as discussed, in the example of FIG. 3, gate electrode 213 may be in an on state such that N-F3ET 240 is in an on state and such that a voltage is applied across the source contact and drain contact of N-F3ET 240.

As shown in FIG. 3 with respect to arrow 216 and blocking indicator 217, high energy electrons may be blocked from traversing from the source contact to the drain contact (e.g., to N+ doped drain 203 and on to a drain contact, not shown) by the band gap provided via P+ doped Fermi filter 205. For example, across P+ doped Fermi filter 205 high energy electron states may not occur and no leakage current associated with such high energy electrons may occur. In the context of the on state of N-F3ET 240, such blocking may cause increased resistance and lower drive current, however such disadvantages may be minor in comparison to the advantages of P+ doped Fermi filter 205 as discussed herein. Furthermore, as shown via arrow 320 and blocking indicator 321, some electrons in high occupancy region 214 may be blocked from traversing N-F3ET 240.

As discussed with respect to FIG. 2 and illustrated via arrow 219, electrons associated with high occupancy region 214 (e.g., as shown via horizontal dashed lines in FIG. 2) and electrons having a slightly higher energy state than those in high occupancy region 214 may tunnel through tunnel junction 210 between P+ doped Fermi filter 205 and N+ doped source 202. In the on state illustrated in FIG. 3 and as shown with respect to arrow 301, such electrons may traverse N-F3ET 240 and provide a drive current during an on state of N-F3ET 240. For example, in the discussed on state, gate electrode 213 may invert channel 201 to allow such electrons to flow.

Figure 4:
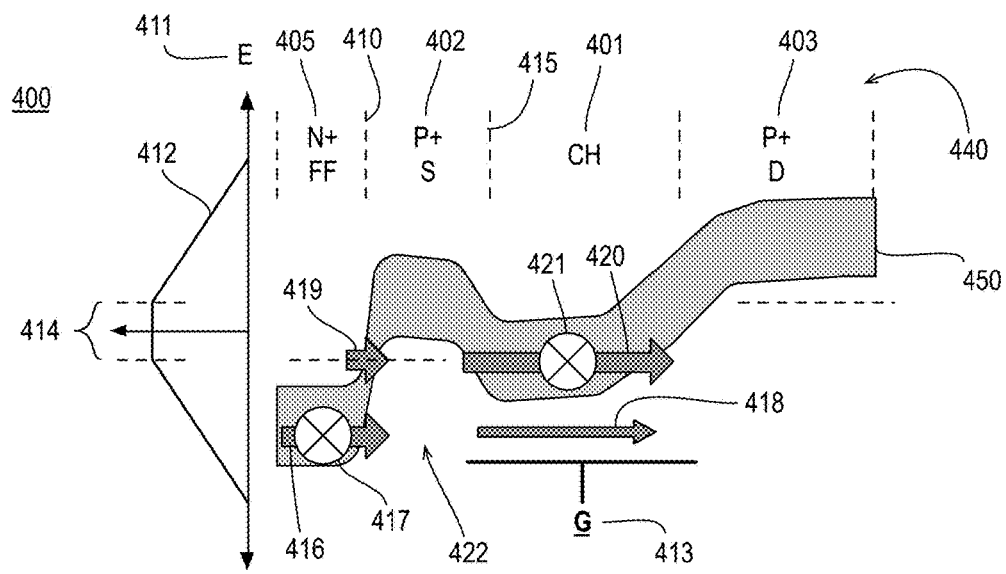
FIG. 4 illustrates an example band diagram for an example P-F3ET in an off state.

FIG. 4 illustrates an example band diagram 400 for an example P-F3ET 440 in an off state, arranged in accordance with at least some implementations of the present disclosure. As shown in FIG. 4, band diagram 400 may include a band gap 450 having an edge indicative of a conduction band and an edge indicative of a valence band. Also as shown in FIG. 4, N-F3ET 440 may include an N+ doped Fermi filter 405, a P+ doped source 402, an undoped or intrinsic channel 401, and a P+ doped drain 403. For example, N+ doped Fermi filter 405, P+ doped source 402, channel 401, and P+ doped drain 403 may be implemented as Fermi filter 105, an source 102, channel 101, and drain 103, respectively. Furthermore, a tunnel junction 410 may be formed or provided between Fermi filter 405 and P+ doped source 402. In the illustration of FIG. 4, for example, tunnel junction 410 may be a homo-junction with N+ doped Fermi filter 405 and P+ doped source 402 having any suitable materials as discussed herein with respect to FIG. 1. However, a hetero junction may also be implemented. Also as shown in FIG. 4, band diagram 400 may illustrate electron energy levels across P-F3ET 440. For example, source and drain electrons (e.g., charge carriers) may have an electron occupancy difference 412 over an energy range 411 (e.g., including a high occupancy region 414) at a source electrode of P-F3ET 440. This suggests holes (empty electron states) are in high occupancy around energy range 414. In the example of FIG. 4, gate electrode 413 may be in an off state such that P-F3ET 440 is in an off state and such that a voltage is applied across the source contact and drain contact of P-F3ET 440 and any current provided across P-F3ET 440 while in the off state may be undesirable leakage current.

As shown, N+ doped Fermi filter 405 may be arranged at a lateral distance from channel 401 and gate electrode 413 (e.g., about 5 to 20 nm) such that N+ doped Fermi filter 405 is spaced away from a source junction 415 between P+ doped source 402 and undoped or intrinsic channel 401. As shown with respect to arrow 416 and blocking indicator 417, high energy holes may be blocked from traversing from the source contact to the drain contact (e.g., to P+ doped drain 403 and on to a drain contact, not shown) by the band gap provided via N+ doped Fermi filter 405. For example, across N+ doped Fermi filter 405 high energy hole or charge carrier states may not occur and no associated leakage current may occur. As shown with respect to arrow 418, in some examples, high energy charge carriers (e.g., holes having high energy states) may accumulate in region 422 and traverse P-F3ET 440 causing undesirable leakage current. However, such leakage current may be greatly reduced via the implementation of N+ doped Fermi filter 405 with high quality, low defect materials for P-F3ET 440.

As also shown in FIG. 4 via arrow 419, holes associated with high occupancy region 414 and/or other holes may tunnel through tunnel junction 410 between N+ doped Fermi filter 405 and P+ doped source 402. However, as shown with respect to arrow 420 and blocking indicator 421, such holes (e.g., charge carriers) may be blocked from traversing based on the band gap of channel 410. For example, in the discussed off state, gate electrode 413 may not invert channel 401 to allow such a traversal of channel 401.

Figure 5:
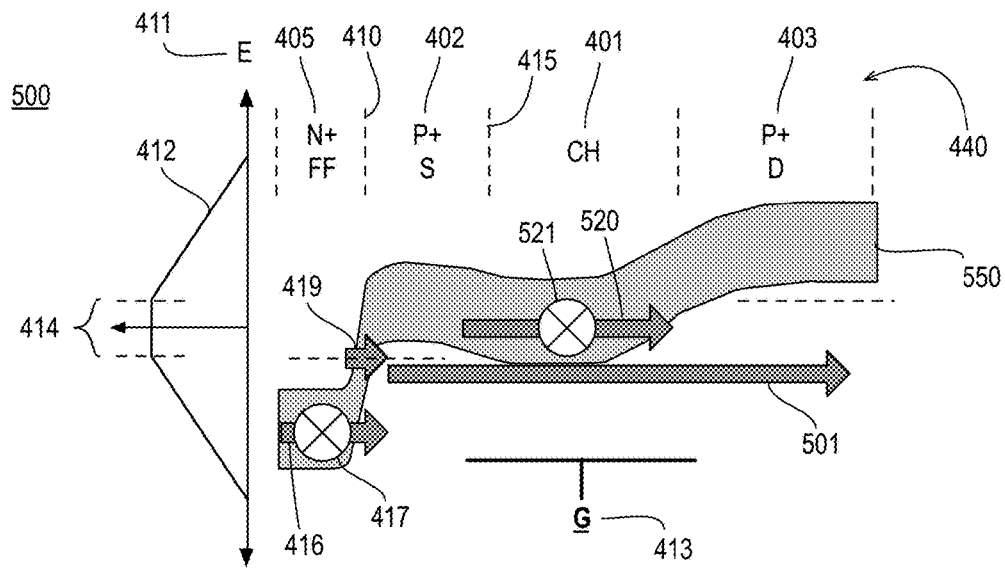
FIG. 5 illustrates an example band diagram for an example P-F3ET in an on state.

FIG. 5 illustrates an example band diagram 500 for example P-F3ET 440 in an on state, arranged in accordance with at least some implementations of the present disclosure. As shown in FIG. 5, band diagram 500 may include a band gap 550 having a top edge indicative of a conduction band and a lower edge indicative of a valence band similar to band gap 450 as illustrated in FIG. 4. In FIG. 5 however, the hump of band gap 450 (e.g., associated with blocking indicator 421) may be raised, modified, or moved or the like based on gate electrode 413 being in an on state. As shown in FIG. 5 with respect to arrow 416 and blocking indicator 417, high energy holes (e.g., charge carriers) may be blocked from traversing from the source contact to the drain contact by the band gap provided via N+ doped Fermi filter 405. Furthermore, as shown via arrow 520 and blocking indicator 521, some holes in high occupancy region 414 may be blocked from traversing P-F3ET 440.

As discussed with respect to FIG. 4 and illustrated via arrow 419, holes associated with high occupancy region 414 and other holes may tunnel through tunnel junction 410 between N+ doped Fermi filter 405 and P+ doped source 402. In the on state illustrated in FIG. 5 and as shown with respect to arrow 501, such holes may traverse P-F3ET 440 and provide a drive current during an on state of P-F3ET 440. For example, in the discussed on state, gate electrode 413 may invert channel 401 to allow such holes (e.g., charge carriers) to flow.

As discussed, the tunnel junctions described herein may be homo-junctions (e.g., a junction between like materials doped to different polarities) as illustrated with respect to FIGS. 2-5 or hetero junctions (e.g., a junction between different materials having different polarities and/or doped to different polarities).

Figure 6A:
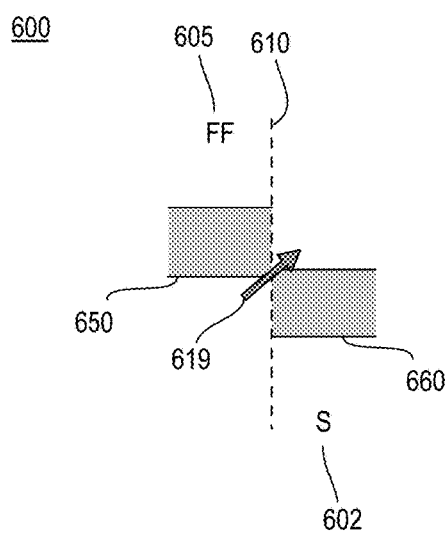
FIG. 6A illustrates an example band diagram for an example tunnel junction for an example N-F3ET.

FIG. 6A illustrates an example band diagram 600 for an example tunnel junction 610 for an example N-F3ET, arranged in accordance with at least some implementations of the present disclosure. As shown, tunnel junction 610 may be a hetero junction between a Fermi filter 605 (e.g., having a positive polarity) having a band gap 650 and a source 602 (e.g., having an opposite negative polarity) having a band gap 660 such that the materials of Fermi filter 605 and source 602 are different. Also, as shown via arrow 619 charge carriers (e.g., electrons) may tunnel through tunnel junction 610 during the operation of a transistor. For example, Fermi filter 605, source 602, and tunnel junction 610 may be implemented as Fermi filter 105, source 102, and tunnel junction 110 (please refer to FIG. 1) or any other N-F3ET discussed herein.

For example, in N-F3ET implementations, source 602 may be an N+ silicon and Fermi filter 605 may be P+ germanium or P+ germanium tin or the like. In other N-F3ET examples, source 602 may be N+ indium gallium arsenide and Fermi filter 605 may be P+ silicon or P+ gallium antimonide or source 602 may be N+ indium arsenide and Fermi filter 605 may be P+ silicon or P+ gallium antimonide or the like. In the illustrated example, tunnel junction 610 is a hetero junction having a staggered gap between band gap 650 and band gap 660 (e.g., such that band gap 650 and band gap 660 have at least a slight overlap). In other examples, tunnel junction 610 may be a hetero junction having a broken gap such that band gap 650 and band gap 660 have no overlap therebetween.

Figure 6B:
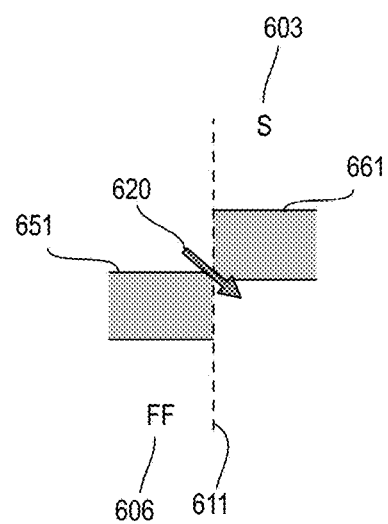
FIG. 6B illustrates an example band diagram for an example tunnel junction for an example P-F3ET.

FIG. 6B illustrates an example band diagram 601 for an example tunnel junction 611 for an example P-F3ET, arranged in accordance with at least some implementations of the present disclosure. As shown, tunnel junction 611 may be a hetero junction between a Fermi filter 606 (e.g., having a negative polarity) having a band gap 651 and a source 603 (e.g., having an opposite positive polarity) having a band gap 661 such that the materials of Fermi filter 606 and source 603 are different. Furthermore, as shown via arrow 619, during the operation of a transistor, charge carriers (e.g., holes) may tunnel through tunnel junction 611. For example, Fermi filter 606, source 603, and tunnel junction 611 may be implemented as Fermi filter 105, source 102, and tunnel junction 110 (please refer to FIG. 1) or any other P-F3ET discussed herein.

For example, in P-F3ET implementations, source 603 may be P+ silicon and Fermi filter 606 may be N+ indium arsenide or indium antimonide or the like. In other P-F3ET examples, source 603 may be P+ germanium and Fermi filter 606 may be N+ silicon or source 603 may be P+ gallium antimonide and Fermi filter 606 may be N+ indium arsenide or N+ indium gallium arsenide or the like. As discussed with respect to FIG. 6A, in the illustrated example of FIG. 6B, tunnel junction 611 is a hetero-junction having a staggered gap between band gap 651 and band gap 661 (e.g., such that band gap 651 and band gap 661 have at least a slight overlap). In other examples, tunnel junction 611 may be a hetero-junction having a broken gap such that band gap 651 and band gap 661 have no overlap therebetween.

Figure 7:
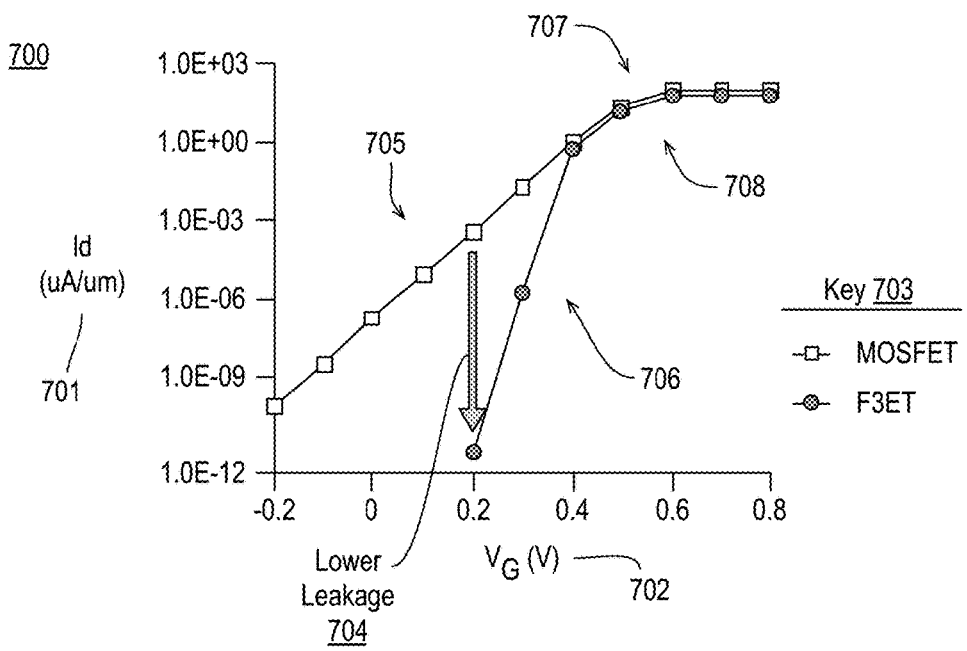
FIG. 7 illustrates an example chart of drain current against gate voltage for an example MOSFET and an example F3ET.

FIG. 7 illustrates an example chart 700 of drain current 701 against gate voltage 702 for an example MOSFET and an example F3ET, arranged in accordance with at least some implementations of the present disclosure. As shown via key 703, drain current examples against example gate voltages for an example MOSFET are indicated via open squares and drain current examples against example gate voltages for an example F3ET are shown via gray circles. For example, chart 700 may illustrate example drain current in microamperes (uA) and example gate voltages in volts (V).

As shown in FIG. 7, region 705 of MOSFET drain current against gate voltage may exhibit a sub-threshold slope limit as discussed herein. Furthermore, region 706 of F3ET drain current against gate voltage may exhibit a substantially increased slope providing for a lower leakage current as illustrated via lower leakage arrow 704. Furthermore, as shown via region 707 of MOSFET drain current against gate voltage and region 708 of F3ET drain current against gate voltage, a MOSFET may have a slightly higher on or drive current with respect to an F3ET due to the resistance of the Fermi filter and/or tunnel junction between the Fermi filter and the source.

Figure 8:
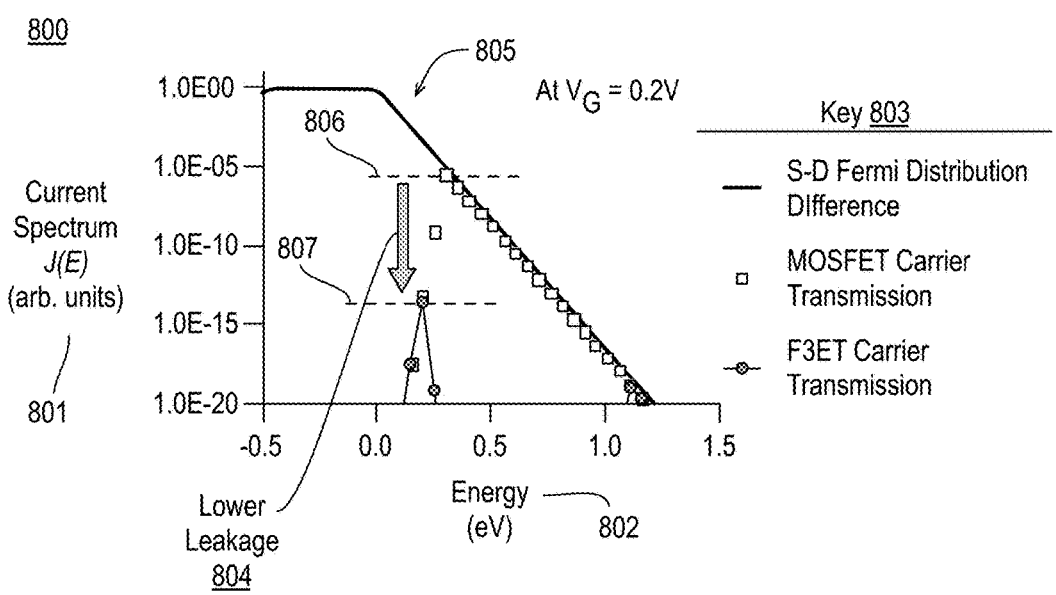
FIG. 8 illustrates an example chart of current spectrum against energy for an example MOSFET and an example F3ET.

FIG. 8 illustrates an example chart 800 of current spectrum 801 against energy 802 for an example MOSFET and an example F3ET, arranged in accordance with at least some implementations of the present disclosure. As shown via key 803, drain current spectrum examples against energy for an example MOSFET are indicated via open squares and drain current spectrum examples against energy for an example F3ET are shown via gray circles. Furthermore, chart 800 illustrates via curve 805 an example source to drain (S-D) Fermi distribution difference. For example, chart 800 may illustrate example current spectrums in arbitrary units as a function of example energies in electron volts (eV) at an example gate voltage (VG) of 0.2 volts (leakage currents as shown in FIG. 7). As shown in FIG. 8 via lower leakage arrow 804, an F3ET may substantially decrease the number of high energy electrons transported between the source and the drain from level 806 (e.g., associated with the MOSFET carrier transmission) to level 807 (e.g., associated with the F3ET carrier transmission), which may lower leakage current.

FIG. 9 is a flow diagram illustrating an example process 900 for forming a transistor having a source Fermi filter, arranged in accordance with at least some implementations of the present disclosure. For example, process 900 may be implemented to fabricate transistor 100 or any other transistor discussed herein. In the illustrated implementation, process 900 may include one or more operations as illustrated by operations 901-904. However, embodiments herein may include additional operations, certain operations being omitted, or operations being performed out of the order provided.

Process 900 may begin at operation 901, "Form a Source and a Drain each having a First Polarity Adjacent to a Channel such that the Channel is between the Source and the Drain", where a source and a drain may be formed each adjacent to a channel such that the channel is disposed between the source and the drain and such that the source and the drain have a first polarity. For example, the source and the drain may be formed on opposite sides of the channel and such that the source and the drain have a first, selected, or predetermined polarity or the like. For example, the source and the drain may be formed by doping a substrate layer (e.g., for planar transistor structure examples) or a fin (e.g., for dual gate or FinFET transistor structures). For example, doping the source and the drain may include an implantation or the like. For example, source 102 and drain 103 (please refer to FIG. 1) may be formed adjacent to channel 101 such that channel 101 is between source 102 and drain 103 and such that source 102 and drain 103 have the same polarity. For example, source 102 and drain 103 may be formed by masking, implant, and mask removal operations or the like. Operation 901 may be performed using conventional state of the art CMOS processes for example.

Process 900 may continue at operation 902, "Dispose a Gate Adjacent to the Channel", a gate may be disposed adjacent to a channel. For example, the gate may include a gate material or materials, a gate stack including a gate dielectric and a gate electrode, or the like. For example, the gate may be formed using deposition and patterned etch techniques, replacement gate techniques, or the like. In planar transistor structure implementations, the gate may be formed over or on a planar channel and, in dual gate or FinFET transistor structures, the gate may be on opposite sides of a fin having a channel (e.g., for dual gate implementations) or strapped over a fin (e.g., for FinFET transistor structures). For example, gate 104 (please refer to FIG. 1) may be disposed adjacent to channel 101. Operation 901 may be performed using conventional state of the art CMOS processes for example. Furthermore, in some examples, operations 901 and 902 may be reversed.

Process 900 may continue at operation 903, Dispose a Fermi Filter having a Polarity Complementary to the Source and the Drain Adjacent to the Source", where a Fermi filter may be disposed adjacent to the source and opposite the channel such that the Fermi filter has a second polarity complementary to the first polarity (e.g., the polarity of the source and the drain), and such that the Fermi filter and the source form a tunnel junction therebetween having a lateral distance from the gate. For example, operation 903 may provide an advantageous process operation over conventional state of the art CMOS processing to provide a Fermi Filter for improved transistor performance as discussed herein. As discussed herein, the tunnel junction may be a homo-junction or a hetero junction. For example, in homo-junction implementations, the homo-junction may be formed in a substrate comprising the Fermi filter, the source, the channel, and the drain. In such examples, disposing the Fermi filter may include doping the substrate in a region adjacent to the source. For example, the doping may include masking, implant, and mask removal operations or the like. For example, Fermi filter 105 may be disposed or formed in substrate layer 111 (please refer to FIG. 1) such that Fermi filter 105, source 102, channel 101, and drain 103 are formed in substrate layer.

Process 900 may continue at operation 904, "Form a Source Contact Adjacent to the Fermi Filter", where a source contact may be formed adjacent to the Fermi filter and opposite the source. For example, the source contact may have the same polarity as the Fermi filter or a polarity complementary to the polarity of the Fermi filter. The source contact may be formed using any suitable technique or techniques such as patterning contact vias in a dielectric and filling with a source metal, patterning a bulk deposited source metal, or the like. For example, source contact 106 (please refer to FIG. 1) may be formed adjacent to Fermi filter 105. In some examples, the drain contact may be formed during the same operations as the source contact and, in other examples, the drain contact may be formed separately from the source contact.

As discussed, process 900 may be implemented to fabricate transistor 100 or any other transistors discussed herein. Any one or more of the operations of process 900 (or operations discussed elsewhere herein) may be undertaken in response to instructions provided by one or more computer program products. Such program products may include signal bearing media providing instructions that, when executed by, for example, a processor, may provide the functionality described herein. For example, the program products may direct machinery and/or equipment to perform the operations discussed herein. The computer program products may be provided in any form of computer readable medium. Thus, for example, a processor including one or more processor core(s) may undertake one or more of the described operations in response to instructions conveyed to the processor by a computer readable medium.

The transistors discussed herein may be implemented to provide any suitable integrated circuit (IC) or portions thereof. For example, N-F3ETs and P-F3ETs may be advantageous for low power devices such as processing units for mobile devices, system-on-a-chip (SOC) devices, or the like. Furthermore, the transistors discussed herein may provide low power and relatively high performance such that the transistors discussed herein may be integrated into high performance and parallel computing environments such as graphics processing units, image signal processors, multi-core processors, or the like.

Figure 10:
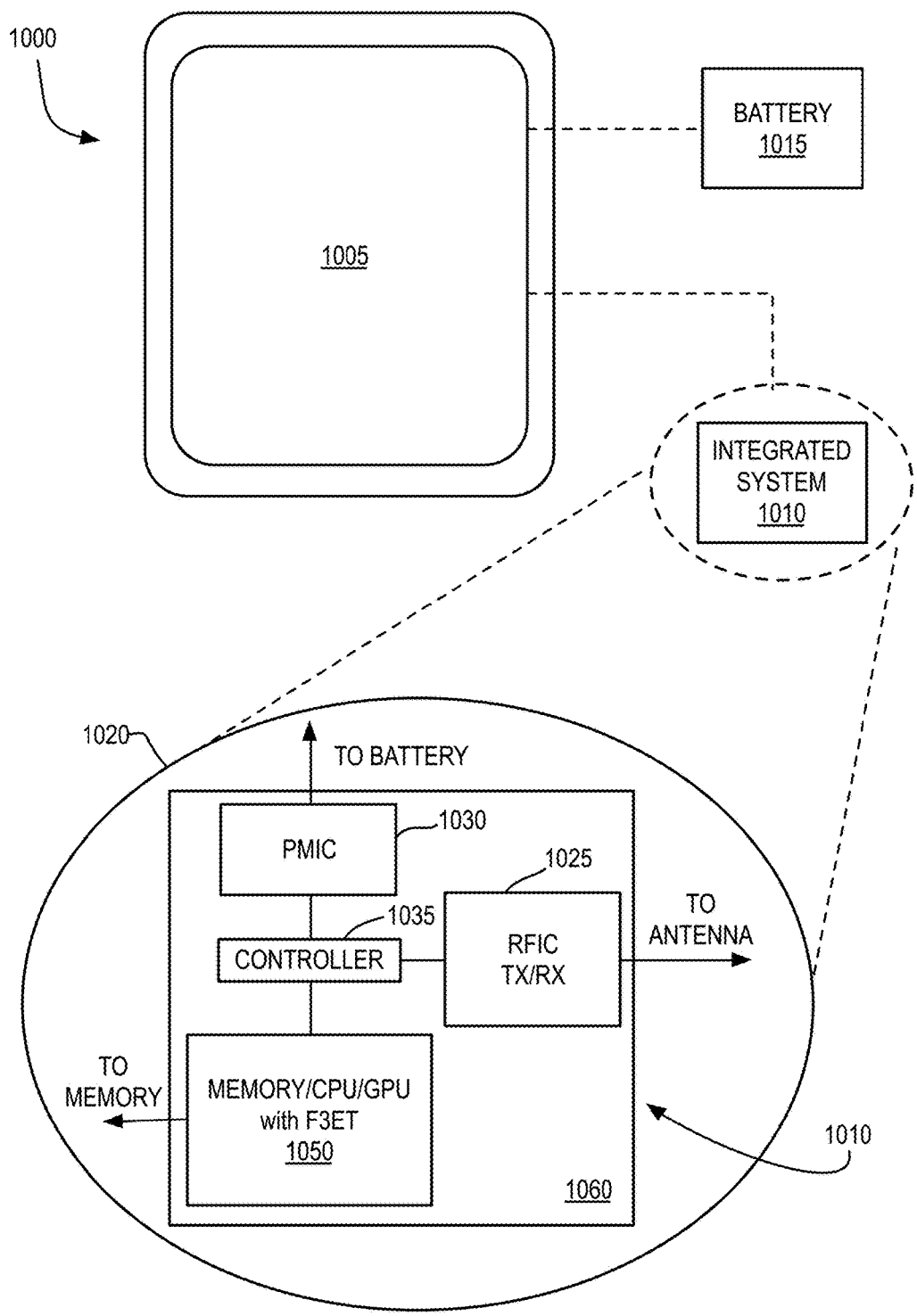
FIG. 10 is an illustrative diagram of a mobile computing platform employing an integrated circuit with source Fermi filter field effect transistors.

FIG. 10 is an illustrative diagram of a mobile computing platform 1000 employing an integrated circuit with source Fermi filter field effect transistors, arranged in accordance with at least some implementations of the present disclosure. A transistor or transistors having Fermi filter(s) may be any transistors as discussed herein such as transistor 100 or the like. In some examples, N-F3ETs and P-F3ETs transistors as discussed herein may be implemented together as a complementary circuit. Furthermore, as described, such F3ETs may employ conventional materials such that they have similar implementation characteristics with respect to CMOS integrated circuits. Mobile computing platform 1000 may be any portable device configured for electronic data display, electronic data processing, wireless electronic data transmission, or the like. For example, mobile computing platform 1000 may be any of a tablet, a smart phone, a netbook, a laptop computer, etc. and may include a display screen 1005, which in the exemplary embodiment is a touchscreen (e.g., capacitive, inductive, resistive, etc. touchscreen), a chip-level (SoC) or package-level integrated system 1010, and a battery 1015.

Integrated system 1010 is further illustrated in the expanded view 1020. In the exemplary embodiment, packaged device 1050 (labeled "Memory/CPU/GPU" in FIG. 10) includes at least one memory chip (e.g., RAM), and/or at least one processor chip (e.g., a microprocessor, a multi-core microprocessor, or graphics processor, or the like). In an embodiment, packaged device 1050 is a microprocessor including an SRAM cache memory. In another embodiment, packaged device 1050 is a graphics processor. In an embodiment, packaged device 1050 includes one or more transistor 100. For example, packaged device 1050 may include a P-F3ET or an N-F3ET or both. For example, an employed transistor may include a channel disposed between a source and a drain such that the source and the drain comprise a first polarity, a gate adjacent to the channel, and a Fermi filter disposed between the source and a source contact such that the Fermi filter comprises a second polarity complementary to the first polarity and the Fermi filter and the source comprise a tunnel junction therebetween having a lateral distance from the gate. In an embodiment, the source, drain, and Fermi filter may comprise silicon as discussed herein. In an embodiment, the tunnel junction may be a hetero junction as discussed herein. The employed transistor may include any characteristics as discussed herein.

As shown, packaged device 1050 may be further coupled to (e.g., communicatively coupled to) a board, a substrate, or an interposer 1060 along with, one or more of a power management integrated circuit (PMIC) 1030, RF (wireless) integrated circuit (RFIC) 1025 including a wideband RF (wireless) transmitter and/or receiver (TX/RX) (e.g., including a digital baseband and an analog front end module further comprises a power amplifier on a transmit path and a low noise amplifier on a receive path), and a controller thereof 1035. In general, packaged device 1050 may be also be coupled to (e.g., communicatively coupled to) display screen 1005.

Functionally, PMIC 1030 may perform battery power regulation, DC-to-DC conversion, etc., and so has an input coupled to battery 1015 and with an output providing a current supply to other functional modules. In an embodiment, PMIC 1030 may perform high voltage operations. As further illustrated, in the exemplary embodiment, RFIC 1025 has an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. In alternative implementations, each of these board-level modules may be integrated onto separate ICs coupled to the package substrate of packaged device 1050 or within a single IC (SoC) coupled to the package substrate of the packaged device 1050.

Figure 11:
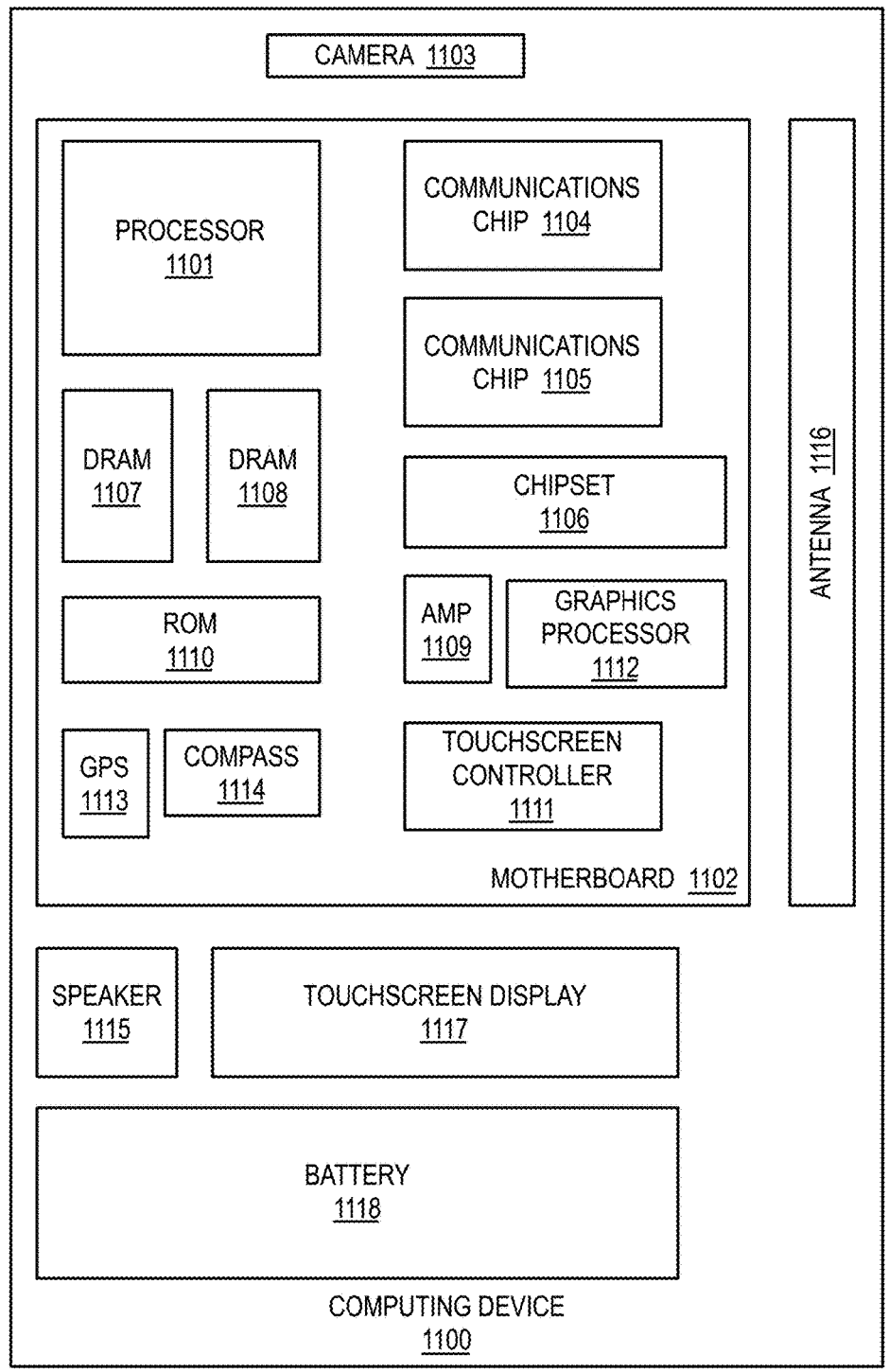
FIG. 11 is a functional block diagram of a computing device, all arranged in accordance with at least some implementations of the present disclosure.

FIG. 11 is a functional block diagram of a computing device 1100, arranged in accordance with at least some implementations of the present disclosure. For example, one or more components of computing device 1100 may employ a transistor having a Fermi filter as discussed herein. Computing device 1100 may be found inside platform 1000, for example, and further includes a motherboard 1102 hosting a number of components, such as but not limited to a processor 1101 (e.g., an applications processor) and one or more communications chips 1104, 1105. Processor 1101 may be physically and/or electrically coupled to motherboard 1102. In some examples, processor 1101 includes an integrated circuit die packaged within the processor 1101. In general, the term "processor" may refer to any device or portion of a device that processes electronic data from registers and/or memory to transform that electronic data into other electronic data that may be stored in registers and/or memory.

In various examples, one or more communication chips 1104, 1105 may also be physically and/or electrically coupled to the motherboard 1102. In further implementations, communication chips 1104 may be part of processor 1101. Depending on its applications, computing device 1100 may include other components that may or may not be physically and electrically coupled to motherboard 1102. These other components may include, but are not limited to, volatile memory (e.g., DRAM) 1107, 1108, non-volatile memory (e.g., ROM) 1110, a graphics processor 1112, flash memory, global positioning system (GPS) device 1113, compass 1114, a chipset 1106, an antenna 1116, a power amplifier 1109, a touchscreen controller 1111, a touchscreen display 1117, a speaker 1115, a camera 1103, and a battery 1118, as illustrated, and other components such as a digital signal processor, a crypto processor, an audio codec, a video codec, an accelerometer, a gyroscope, and a mass storage device (such as hard disk drive, solid state drive (SSD), compact disk (CD), digital versatile disk (DVD), and so forth), or the like.

Communication chips 1104, 1105 may enables wireless communications for the transfer of data to and from the computing device 1100. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 1104, 1105 may implement any of a number of wireless standards or protocols, including but not limited to those described elsewhere herein. As discussed, computing device 1100 may include a plurality of communication chips 1104, 1105. For example, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others. Furthermore, in some examples, an F3ET as discussed herein may be used to implement some of these electronic components together with conventional CMOS.

As used in any implementation described herein, the term "module" refers to any combination of software, firmware and/or hardware configured to provide the functionality described herein. The software may be embodied as a software package, code and/or instruction set or instructions, and "hardware", as used in any implementation described herein, may include, for example, singly or in any combination, hardwired circuitry, programmable circuitry, state machine circuitry, and/or firmware that stores instructions executed by programmable circuitry. The modules may, collectively or individually, be embodied as circuitry that forms part of a larger system, for example, an integrated circuit (IC), system on-chip (SoC), and so forth.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

The following examples pertain to further embodiments.

In one or more first embodiments, a transistor comprises a channel disposed between a source and a drain, wherein the source and the drain comprise a first polarity, a gate adjacent to the channel, and a Fermi filter disposed between the source and a source contact, wherein the Fermi filter comprises a second polarity complementary to the first polarity, and wherein the Fermi filter and the source comprise a tunnel junction therebetween having a lateral distance from the gate.

Further to the first embodiments, the tunnel junction comprises a hetero junction.

Further to the first embodiments, the tunnel junction comprises a hetero junction, the source comprises an N+ doped silicon, and the Fermi filter comprises at least one of germanium or germanium tin.

Further to the first embodiments, the tunnel junction comprises a hetero junction, the source comprises a P+ doped silicon, and the Fermi filter comprises at least one of indium arsenide or indium antimonide.

Further to the first embodiments, the tunnel junction comprises a hetero junction, the source comprises at least one of an N+ doped indium gallium arsenide or an N+ doped indium arsenide, and the Fermi filter comprises at least one of silicon or gallium antimonide Further to the first embodiments, the tunnel junction comprises a hetero junction, the source comprises a P+ doped gallium antimonide, and the Fermi filter comprises at least one of indium arsenide or indium gallium arsenide.

Further to the first embodiments, the tunnel junction comprises a homo-junction. Further to the first embodiments, the tunnel junction comprises a homo-junction and the channel, the source, and the drain comprise silicon.

Further to the first embodiments, the tunnel junction comprises a homo-junction, the channel, the source, and the drain comprise silicon, and the source and the Fermi filter comprise heavily doped silicon having dopant concentrations of not less than $10^{18}$ cm$^{-3}$.

Further to the first embodiments, the lateral distance from the gate to the tunnel junction comprises a distance of not less than 5 nanometers and not more than 20 nanometers.

Further to the first embodiments, the transistor comprises at least one of a planar transistor structure, a dual gate transistor structure, a FinFET transistor structure, or a nanowire transistor structure.

Further to the first embodiments, the source, the channel, and the drain comprise silicon and wherein the tunnel junction comprises a hetero junction.

Further to the first embodiments, the source, the channel, and the drain comprise silicon, the tunnel junction comprises a hetero junction, and the Fermi filter comprises at least one of germanium, germanium tin, indium arsenide, or indium antimonide.

In one or more second embodiments, a transistor comprises a channel disposed between a source and a drain, wherein the source and the drain comprise a first polarity, and wherein the channel, the source, and the drain comprise silicon, a gate disposed over the channel, and a Fermi filter disposed between the source and a source contact, wherein the Fermi filter comprises a second polarity complementary to the first polarity, and wherein the Fermi filter and the source comprise a tunnel hereto junction therebetween having a lateral distance from the gate.

Further to the second embodiments, the source comprises an N+ doped silicon and the Fermi filter comprises at least one of germanium or germanium tin.

Further to the second embodiments, the source comprises a P+ doped silicon and the Fermi filter comprises at least one of indium arsenide or indium antimonide.

Further to the second embodiments, the lateral distance from the gate to the tunnel junction comprises a distance of not less than 5 nanometers and not more than 20 nanometers.

Further to the second embodiments, the transistor comprises at least one of a planar transistor structure, a dual gate transistor structure, a FinFET transistor structure, or a nanowire transistor structure.

In one or more third embodiments, a method for fabricating a transistor comprises forming a source and a drain each adjacent to a channel, wherein the channel is disposed between the source and the drain, and wherein the source and the drain comprise a first polarity, disposing a gate adjacent to the channel, disposing a Fermi filter adjacent to the source and opposite the channel, wherein the Fermi filter comprises a second polarity complementary to the first polarity, and wherein the Fermi filter and the source comprise a tunnel junction therebetween having a lateral distance from the gate, and forming a source contact adjacent to the Fermi filter and opposite the source.

Further to the third embodiments, the tunnel junction comprises a homo-junction formed in a substrate layer comprising the Fermi filter, the source, the channel, and the drain and disposing the Fermi filter comprises doping the substrate in a region adjacent to the source.

Further to the third embodiments, the tunnel junction comprises a hetero junction and disposing the Fermi filter adjacent to the source and opposite the channel comprises an epitaxial growth.

Further to the third embodiments, the tunnel junction comprises a hetero junction, disposing the Fermi filter adjacent to the source and opposite the channel comprises an epitaxial growth, the source comprises silicon, and the Fermi filter comprises at least one of germanium, germanium tin, indium arsenide, or indium antimonide.

Further to the third embodiments, the transistor comprises at least one of a planar transistor structure, a dual gate transistor structure, or a FinFET transistor structure.

In one or more fourth embodiments, a system comprises a graphics processing unit further comprising a transistor including a channel disposed between a source and a drain, wherein the source and the drain comprise a first polarity, a gate adjacent to the channel, and a Fermi filter disposed between the source and a source contact, wherein the Fermi filter comprises a second polarity complementary to the first polarity, and wherein the Fermi filter and the source comprise a tunnel junction therebetween having a lateral distance from the gate.

Further to the fourth embodiments, the source comprises doped silicon and the tunnel junction comprises a hetero junction.

Further to the fourth embodiments, the tunnel junction comprises a homo-junction and the source, the drain, the channel, and the Fermi filter comprise at least one of silicon or germanium.

Further to the fourth embodiments, the lateral distance from the gate to the tunnel junction comprises a distance of not less than 5 nanometers and not more than 20 nanometers.

Further to the fourth embodiments, the transistor comprises at least one of a planar transistor structure, a dual gate transistor structure, or a FinFET transistor structure.

It will be recognized that the invention is not limited to the embodiments so described, but can be practiced with modification and alteration without departing from the scope of the appended claims. For example, the above embodiments may include specific combination of features. However, the above embodiments are not limited in this regard and, in various implementations, the above embodiments may include the undertaking only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:

1. A transistor comprising:
    a channel disposed between a source and a drain, wherein the source and the drain comprise a first polarity;
    a gate adjacent to the channel; and
    a Fermi filter disposed between the source and a source contact, wherein the Fermi filter comprises a second polarity complementary to the first polarity, wherein the Fermi filter and the source comprise a tunnel junction therebetween having a lateral distance from the gate, wherein the source, the channel, and the drain comprise silicon, wherein the tunnel junction comprises a hetero-junction, and wherein the Fermi filter comprises at least one of germanium, germanium tin, indium arsenide, or indium antimonide.

2. The transistor of claim 1, wherein the source comprises N+doped silicon and the Fermi filter comprises at least one of germanium or germanium tin.

3. The transistor of claim 1, wherein the source comprises P+doped silicon and the Fermi filter comprises at least one of indium arsenide or indium antimonide.

4. The transistor of claim 1, wherein the lateral distance from the gate to the tunnel junction comprises a distance of not less than 5 nanometers and not more than 20 nanometers.

5. The transistor of claim 1, wherein the transistor comprises at least one of a planar transistor structure, a dual gate transistor structure, a FinFET transistor structure, or a nanowire transistor structure.

6. A system comprising:
    a graphics processing unit further comprising a transistor including:
        a channel disposed between a source and a drain, wherein the source and the drain comprise a first polarity;
        a gate adjacent to the channel; and
        a Fermi filter disposed between the source and a source contact, wherein the Fermi filter comprises a second polarity complementary to the first polarity, wherein the Fermi filter and the source comprise a tunnel junction therebetween having a lateral distance from the gate, wherein the source, the channel, and the drain comprise silicon, wherein the tunnel junction comprises a hetero-junction, and wherein the Fermi filter comprises at least one of germanium, germanium tin, indium arsenide, or indium antimonide.

7. The system of claim 6, wherein the source comprises N+ doped silicon and the Fermi filter comprises at least one of germanium or germanium tin.

8. The system of claim 6, wherein the source comprises P+ doped silicon and the Fermi filter comprises at least one of indium arsenide or indium antimonide.

9. The system of claim 6, wherein the lateral distance from the gate to the tunnel junction comprises a distance of not less than 5 nanometers and not more than 20 nanometers.

10. The system of claim 6, wherein the transistor comprises at least one of a planar transistor structure, a dual gate transistor structure, a FinFET transistor structure, or a nanowire transistor structure.

11. A transistor comprising:
    a channel disposed between a source and a drain, wherein the source and the drain comprise a first polarity;
    a gate adjacent to the channel; and
    a Fermi filter disposed between the source and a source contact, wherein the Fermi filter comprises a second polarity complementary to the first polarity, wherein the Fermi filter and the source comprise a tunnel junction therebetween having a lateral distance from the gate, wherein the tunnel junction comprises a hetero-junction, and wherein the source comprises at least one of an N+ doped indium gallium arsenide or an N+ doped indium arsenide and the Fermi filter comprises at least one of silicon or gallium antimonide.

12. The transistor of claim 11, wherein the lateral distance from the gate to the tunnel junction comprises a distance of not less than 5 nanometers and not more than 20 nanometers.

13. The transistor of claim 11, wherein the transistor comprises at least one of a planar transistor structure, a dual gate transistor structure, a FinFET transistor structure, or a nanowire transistor structure.

14. A transistor comprising:
    a channel disposed between a source and a drain, wherein the source and the drain comprise a first polarity;

a gate adjacent to the channel; and a Fermi filter disposed between the source and a source contact, wherein the Fermi filter comprises a second polarity complementary to the first polarity, wherein the Fermi filter and the source comprise a tunnel junction therebetween having a lateral distance from the gate, wherein the tunnel junction comprises a hetero-junction, and wherein the source comprises a P+ doped gallium antimonide and the Fermi filter comprises at least one of indium arsenide or indium gallium arsenide.

15. The transistor of claim 14, wherein the lateral distance from the gate to the tunnel junction comprises a distance of not less than 5 nanometers and not more than 20 nanometers.

16. The transistor of claim 14, wherein the transistor comprises at least one of a planar transistor structure, a dual gate transistor structure, a FinFET transistor structure, or a nanowire transistor structure.

17. A transistor comprising:

a channel disposed between a source and a drain, wherein the source and the drain comprise a first polarity;

a gate adjacent to the channel; and a Fermi filter disposed between the source and a source contact, wherein the Fermi filter comprises a second polarity complementary to the first polarity, wherein the Fermi filter and the source comprise a tunnel junction therebetween having a lateral distance from the gate, wherein the tunnel junction comprises a homo-junction, wherein the channel, the source, and the drain comprise silicon, and wherein the source and the Fermi filter comprise heavily doped silicon having dopant concentrations of not less than $10^{18}$ cm$^{-3}$.

18. The transistor of claim 17, wherein the lateral distance from the gate to the tunnel junction comprises a distance of not less than 5 nanometers and not more than 20 nanometers.

19. The transistor of claim 17, wherein the transistor comprises at least one of a planar transistor structure, a dual gate transistor structure, a FinFET transistor structure, or a nanowire transistor structure.

* * * * *